US009551089B2

(12) United States Patent
Ouellette et al.

(10) Patent No.: US 9,551,089 B2
(45) Date of Patent: Jan. 24, 2017

(54) SAPPHIRE SHEETS AND APPARATUS AND METHOD FOR PRODUCING SAPPHIRE SHEETS WITH ANGLED HEAT SHIELDS

(71) Applicant: Saint-Gobain Ceramics & Plastics, Inc., Worcester, MA (US)

(72) Inventors: Marc Ouellette, Nashua, NH (US); Joseph M. Collins, Dublin, NH (US); John Walter Locher, Amherst, NH (US); Guilford L. Mack, III, Manchester, NH (US); Abbie M. Jennings, Milford, NH (US); Jan J. Buzniak, Solon, OH (US); Christopher D. Jones, Amherst, NH (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 237 days.

(21) Appl. No.: 14/212,285

(22) Filed: Mar. 14, 2014

(65) Prior Publication Data
US 2014/0311402 A1 Oct. 23, 2014

Related U.S. Application Data

(60) Provisional application No. 61/791,364, filed on Mar. 15, 2013, provisional application No. 61/857,988, filed on Jul. 24, 2013.

(51) Int. Cl.
*C30B 15/34* (2006.01)
*C01F 7/02* (2006.01)
*C30B 29/20* (2006.01)

(52) U.S. Cl.
CPC ............... *C30B 15/34* (2013.01); *C01F 7/02* (2013.01); *C30B 29/20* (2013.01); *Y10T 117/1044* (2015.01); *Y10T 428/2976* (2015.01)

(58) Field of Classification Search
CPC combination set(s) only.
See application file for complete search history.

(56) References Cited

U.S. PATENT DOCUMENTS 4,028,059 A 6/1977 LaBelle, Jr. et al.
4,185,076 A 1/1980 Hatch et al.
(Continued)

FOREIGN PATENT DOCUMENTS

CN 1946882 A 4/2007
CN 200981899 Y 11/2007
(Continued)

OTHER PUBLICATIONS

U.S. Appl. No. 14/212,492, filed Mar. 14, 2014 Inventors: Marc Ouellette, et al.
The International Search Report and the Written Opinion received from the International Searching Authority (ISA/KR) for International Application No. PCT/US2014/028172 dated Jul. 18, 2014, 13 pages.
(Continued)

*Primary Examiner* — Duy Deo
*Assistant Examiner* — Erin Bergner
(74) *Attorney, Agent, or Firm* — Abel Law Group, LLP; Robert N Young (57) ABSTRACT

The present disclosure is directed to an apparatus and method for growing a sapphire sheet via edge-defined film-fed growth (EFG) including an angled heat shield with respect to the a side surface of a die tip. The present disclosure is further directed to an sapphire sheets and batches of such sheets having features such as a particular maximum low spot thickness.

16 Claims, 4 Drawing Sheets

(56) References Cited

U.S. PATENT DOCUMENTS

| | | | |
|---|---|---|---|
| 4,271,129 | A | 6/1981 | Berkman et al. |
| 4,334,948 | A | 6/1982 | Berkman et al. |
| 4,390,505 | A * | 6/1983 | Taylor .................... C30B 15/34 117/211 |
| 4,402,786 | A | 9/1983 | Little |
| 5,450,814 | A | 9/1995 | Shiraishi et al. |
| 5,932,008 | A | 8/1999 | Hiraishi et al. |
| 6,338,757 | B1 | 1/2002 | Nishimoto et al. |
| 7,348,076 | B2 | 3/2008 | Locher et al. |
| 7,682,452 | B2 | 3/2010 | Outwater |
| 7,972,196 | B2 | 7/2011 | Tanikella et al. |
| 8,685,161 | B2 | 4/2014 | Locher et al. |
| 2008/0053372 | A1* | 3/2008 | Anttila .................... C30B 15/14 117/200 |
| 2008/0075941 | A1 | 3/2008 | Tartartchenko et al. |
| 2008/0164458 | A1 | 7/2008 | Tanikella et al. |
| 2008/0282968 | A1 | 11/2008 | Amosov |
| 2012/0118228 | A1 | 5/2012 | Lee et al. |
| 2014/0272413 | A1 | 9/2014 | Ouellette et al. |

FOREIGN PATENT DOCUMENTS

| | | |
|---|---|---|
| CN | 202482487 U | 10/2012 |
| CN | 105189837 A | 12/2015 |
| EP | 2971276 A1 | 1/2016 |
| JP | 2001270797 A | 10/2001 |
| JP | 2003327495 A | 11/2003 |
| JP | 2010504274 A | 2/2010 |
| TW | 201435158 A | 9/2014 |
| WO | 2005100646 A1 | 10/2005 |
| WO | 2008036888 A1 | 3/2008 |
| WO | 2014143955 A1 | 9/2014 |

OTHER PUBLICATIONS

The International Search Report and the Written Opinion received from the International Searching Authority (ISA/KR) for International Application No. PCT/US2014/028156 dated Jul. 24, 2014, 12 pages.

* cited by examiner

SAPPHIRE SHEETS AND APPARATUS AND METHOD FOR PRODUCING SAPPHIRE SHEETS WITH ANGLED HEAT SHIELDS

FIELD OF THE DISCLOSURE

The present disclosure is directed to sapphire sheets and apparatuses and methods for forming sapphire sheets particularly by Edge-Defined Film Growth (EFG).

BACKGROUND

Sapphire crystals are used in a variety of applications. For example, sapphire sheets can be used for various demanding, high performance military and commercial applications, such as ballistic and targeting windows. Further improvement of sapphire sheets, in particular in the dimensional stability during production of large and thick sapphire sheets is desired.

BRIEF DESCRIPTION OF THE DRAWINGS

Embodiments are illustrated by way of example and are not limited in the accompanying figure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the term "C-plane sapphire" refers to substantially planar single crystal sapphire, the C-axis of which is substantially normal (±10 degrees) to the major planar surface of the material. Typically, the C-axis is less than about 1 degree from the major planar surface.

As used herein, the term "A-plane sapphire" refers to substantially planar single crystal sapphire, the A-axis of which is substantially normal (±10 degrees) to the major planar surface of the material. Typically, the A-axis is less than about 1 degree from the major planar surface.

As used herein, the term "R-plane sapphire" refers to substantially planar single crystal sapphire, the R-axis of which is substantially normal (±10 degrees) to the major planar surface of the material. Typically, the R-axis is less than about 1 degree from the major planar surface.

Each of the crystallographic planes in sapphire discussed herein are as is commonly known in the art. It is to be understood that as used herein, mention of a particular orientation of a crystal sheet to a specific plane include all off-angle or mis-angle, miscut, or the like orientations in which the reference plane is tilted to another plane. For example, it is often desirable to product crystal sheets having a general A-plane or C-plane orientation, but include a desired tilt or miscut angle toward the M-plane. Accordingly, use of the phrase "A-plane" or "C-plane" for example, include this plane as the general reference plane with any desired offcut or misangle orientation.

The following table below illustrates the miller indices and d spacing of the common crystallographic planes in sapphire:

TABLE A

| Plane | Miller Indices | d Spacing |
|---|---|---|
| a | (11-20), (-12-10), (-2110) (-1-120), (1-210), (2-1-10) | 2.379 Å |
| m | (10-10), (01-10), (-1100) (-1010), (0-110), (1-100) | 1.375 Å |
| c | (0001) | 2.165 Å |
| r | (1-102), (01-12), (-1012) | 1.964 Å |
| n | (11-23), (-12-13), (-2113) (-1-123), (1-213), (2-1-13) | 1.147 Å |
| s | (10-11), (-1101), (0-111) | 1.961 Å |

The term "averaged," when referring to a value, is intended to mean an average, a geometric mean, or a median value.

As used herein, the terms "comprises", "comprising", "includes", "including", "has", "having", or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the crystal and particularly sapphire crystal arts.

Figure 1:
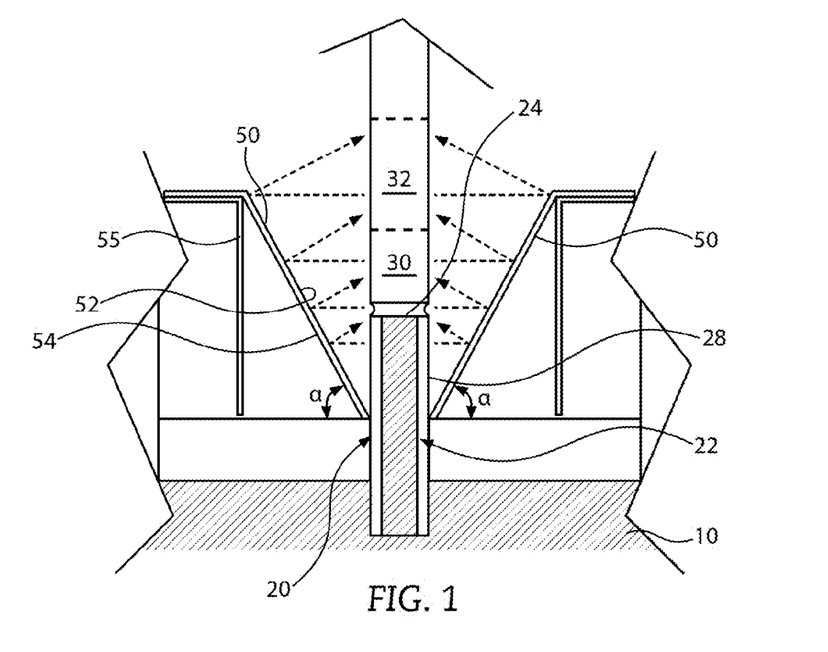
FIG. 1 illustrates an EFG growth apparatus according to an embodiment of the present disclosure.

FIG. 1 illustrates an apparatus for growing a sapphire sheet via edge-defined film-fed growth (EFG) according to a first aspect of the disclosure. The apparatus may be similar to an apparatus such as described in U.S. Pat. No. 7,348,076, which is incorporated herein by reference for all useful purposes. The apparatus can include a melt source 10; a die 20, including a die tip 22 and die opening 24 adjacent the melt source 10; a first region 30 adjacent the die opening 24; and a heat reflective shield 50. The die tip 22 includes a top surface 26 which includes the die opening 24, and two side surfaces 28 extending generally perpendicular to the top surface 26. The heat reflective shield 50 can be angled with respect to the horizontal plane. The horizontal plane refers to the plane perpendicular to the two vertically extending side surfaces 28 of the die tip. As used herein, a heat reflective shield angled with respect to the horizontal plane includes all orientations other than perpendicular and parallel with the horizontal plane.

In certain embodiments, the heat reflective shield 50 can be disposed adjacent to both the die tip 22 and the first region 30. The heat reflective shield 50 can include a first surface 52 facing the die and a second surface 54 opposite the first surface 52. The heat reflective shield 50 can be configured to direct (or reflect) heat energy contacting the first surface 52 of the heat reflective shield towards a region of lower temperature, such as in a second region 32, above the first region 30. Reflecting heat radiating from the first region 30 to a region of lower temperature can increase the thermal gradient in the first region 30 above the die relative to an apparatus having a heat shield parallel to the side surface of the die tip. As such, the heat reflective shield 50 can be configured to control a first thermal gradient from reflected heat in both a lateral direction and a vertical direction. This in contrast with a heat shield which is perpendicular to the horizontal plane (or parallel with the side surface of the die tip), which reflects most of its heat in the lateral direction thereby not enabling control of the thermal gradient from reflected heat in a vertical direction. By angling the heat shield with respect to the horizontal plane, a significant amount of the radiated heat can be reflected to an area different from which it originated.

As used herein, "thermal gradient" refers to the average change in temperature over a distance between two locations in an EFG growth apparatus. The distance between the two locations is measured on a line along which the single crystal sapphire advances during the production process. For example, in an EFG technique, the temperature difference may be 50 degrees Celsius between a first position in the apparatus and a second position in the apparatus. Thermal gradient units may be, for example, "degrees per cm" or "degrees per inch." If not specified, the temperature change is from a higher temperature to a lower temperature as the sapphire crystal passes from the first location to the second through the gradient.

FIG. 1 further illustrates a vertical heat shield 55 disposed further away from the heat reflective shield 50. In certain embodiments, the EFG apparatus can include both a vertical heat shield 55 and the angled heat reflective shield 50. In other embodiments, only the angled heat reflective shield 50 may be present.

In certain embodiments, the heat reflective shield 50 can have an angle α with the horizontal plane of no less than about 4 degrees, no less than about 5 degrees, no less than about 10 degrees, no less than about 15 degrees, no less than about 20 degrees, no less than about 25 degrees, no less than about 30 degrees, no less than about 35 degrees, no less than about 40 degrees, no less than about 45 degrees, no less than about 50 degrees, no less than about 55 degrees, no less than about 60 degrees, no less than about 65 degrees, no less than about 70 degrees, no less than about 75 degrees, no less than about 80 degrees, or even no less than about 85 degrees. In further embodiments, the heat reflective shield can have an angle α of no greater than about 88 degrees, no greater than about 85 degrees, no greater than about 80 degrees, no greater than about 75 degrees, or even no greater than about 70 degrees with horizontal plane.

The heat reflective shield 50 can be constructed from any material that can manipulate the flow of heat radiation within the EFG apparatus. In certain embodiments, the heat reflective shield 50 can be constructed from a metal, such as for example, a refractory metal.

Figure 2:
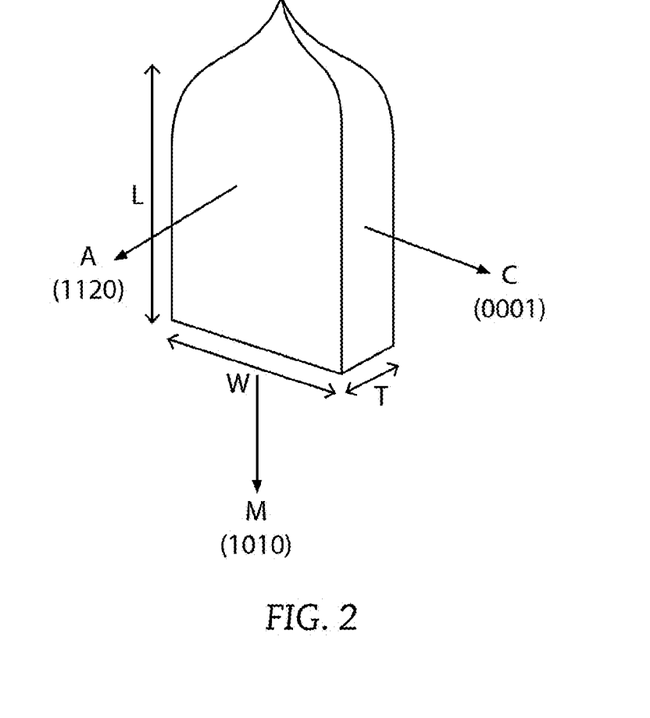
FIG. 2 illustrates a sketch of a sapphire sheet.

FIG. 2 illustrates a sketch of a sapphire ribbon 100. The sapphire ribbon 100 includes a length L, a width W, and a thickness T. The length can be greater than or equal to the width. The length and the width can be greater than thickness.

In certain embodiments, the length of the sapphire sheet grown in an EFG growth apparatus can be at least 6 inches, at least 12 inches, at least 24 inches, or even at least 30 inches. In certain embodiments, the length of the sapphire sheet grown in the EFG growth apparatus can be no greater than 60 inches, no greater than 80 inches or even no greater than 100 inches.

In certain embodiments, the width of the sapphire sheet grown in an EFG growth apparatus can be at least 1 inch, at least 2 inches, at least 3 inches, at least 4 inches, at least 6 inches, or even at least 8 inches. In certain embodiments, the width of the sapphire sheet grown in the EFG growth apparatus can be no greater than 20 inches, no greater than 30 inches, no greater than 50 inches or even no greater than 100 inches. The nominal width of the sapphire sheet is determined based on the width of the die opening 24. In certain embodiments, the die opening 24 can have a width of at least 1 inch, at least 2 inches, at least 3 inches, at least 4 inches, at least 6 inches, or even at least 8 inches.

In certain embodiments, the thickness of the sapphire sheet grown in an EFG growth apparatus can be at least 0.1 mm, at least 0.2 mm, at least 0.3 mm, at least 0.4 mm, at least 0.5 mm, at least 0.6 mm, at least 0.7 mm, or even at least 0.75 mm, such at least about 0.8 mm, at least about 1.0 mm. In certain embodiments, the thickness of the sapphire sheet grown in the EFG growth apparatus can be no greater than 2 mm, no greater than 5 mm, no greater than 10 mm, no greater than 15 mm, no greater than 50 mm, or even no greater than 100 mm. The desired nominal thickness of the sapphire sheet can be selected based on the thickness of the die. In certain embodiments, the die opening can have a thickness of at least 0.1 mm, at least 0.2 mm, at least 0.3 mm, at least 0.4 mm, at least 0.5 mm, at least 0.6 mm, at least 0.7 mm, or even at least 0.75 mm. A particular advantage of the present disclosure is to form sapphire sheets having a minimum thickness as close as possible to the thickness of the die opening or the nominal thickness. In certain embodiments, the ratio of the minimum thickness of the sapphire sheet to the thickness of the die opening can be at least about 0.90:1, at least about 0.93:1, or even at least about 0.95:1. In this context, the minimum thickness of the sapphire sheet is determined by the maximum low spot measurement described herein.

In certain embodiments, the length of the heat reflective shield can be quantified in relation to the width of the sapphire sheet. For example, in certain embodiments, a ratio of the length of the angled surface of the heat shield to the width of the sapphire sheet can be less than about 2:1, less than about 1:1, less than about 1:2, less than about 1:3, or even less than about 1:4.

Certain further embodiments described herein are directed to a method of forming a sapphire sheet. In certain embodiments, a method of forming a sapphire sheet can include crystallizing a sapphire sheet above a die, cooling the sapphire sheet in a first region adjacent the die, and controlling a thermal gradient across a thickness of the sapphire sheet in the first region. In certain embodiments, there may be a second thermal gradient adjacent to the first thermal gradient, wherein the second thermal gradient is further away from the die opening than the first thermal gradient, and wherein the second thermal gradient is less than the first thermal gradient.

Prior to crystallizing, the method can include seeding a melt fixture with a seed having a desired axis orientation substantially perpendicular to a longitudinal axis of a die opening. The EFG apparatus, and the sapphire ribbon produced therefrom can have any desired crystal orientation. In certain embodiments, the sapphire ribbons can have a C-axis, an A-axis, an R-axis, a M-axis, a N-axis, or an S-axis orientation substantially perpendicular to the sapphire ribbon's major surface. In certain particular embodiments, the sapphire ribbon can have a C-axis, an A-axis, or an R-axis orientation substantially perpendicular to the sapphire ribbon's major surface. In particular embodiments, the sapphire ribbons have a C-axis orientation substantially perpendicular to the sapphire ribbon's major surface. The crystal orientation can be determined by seeding a melt fixture with a seed having known, desired orientation substantially perpendicular to a longitudinal axis of a die opening. The thus formed ribbon will then have a corresponding orientation substantially perpendicular to the sapphire ribbon's major surface.

Controlling of the thermal gradient across the thickness of the sapphire sheet in the first region can include maintaining a thermal gradient of at least about 1 degrees/mm, at least about 1.3 degrees/mm, at least about 1.6 degrees/mm, at least about 2.0 degrees/mm, at least about 2.5 degrees/mm, or even at least about 3.0 degrees/mm.

In certain embodiments, the first thermal gradient can extend along the forming plane for a distance of at least about 1 cm, at least about 2 cm, at least about 3 cm, at least about 5 cm, or even at least about 10 cm.

Moreover, in certain embodiments, the first region can have a desired dwell time. The dwell time is the time a specific point spends within a particular region. In certain embodiments, the dwell time of a specific point on the sapphire sheet in the first region can be at least 10 minutes, at least 12 minutes, at least 14 minutes, or even at least 18 minutes.

The speed of forming the sapphire sheet is partially controlled by the draw rate. The draw rate is the speed of the sapphire sheet is pulled through the forming region. In certain embodiments, the draw rate of the sapphire sheet can be at least 2.5 cm/hr, at least 5 cm/hr, or even at least 10 cm/hr.

In certain embodiments, cooling can include reflecting a significant amount of radiant heat away from the first region. For example, a significant amount can include an amount sufficient to maintain the thermal gradient as discussed above.

A particular achievement of the present disclosure is the reduction of the Total Thickness Variation (TTV), maximum low spot content, and standard deviation from planar of the sapphire sheet. In certain embodiments, the sapphire sheet can have a Total Thickness Variation (TTV) of no greater than about 0.2 mm, no greater than about 0.5 mm, no greater than about 0.7 mm, no greater than about 0.8 mm, or even no greater than about 1.0 mm, such as no greater than about 1.2 mm, no greater than about 1.5 mm, or even no greater than about 2.0 mm. As used herein, the TTV is the difference between maximum and minimum thickness values along a segment spanning the length and width of the sheet. As discussed within this disclosure, the sapphire sheet can be measured for thickness every square inch and thereby generate a thickness map of the entire sheet as is understood by one of skill in the art. The TTV values presented herein refer to the difference between the minimum and maximum thickness values obtained through generation of the thickness map, measuring every square inch.

In certain embodiments, the sapphire sheet can have a maximum low spot thickness of no greater than about 0.2 mm, no greater than about 0.3 mm, no greater 0.4 mm, no greater than about 0.5 mm, no greater than about 0.6 mm no greater than about 0.7 mm, or even no greater than about 0.75 mm, such as no greater than about 0.8 mm, no greater than about 0.9 mm, no greater than about 1.2 mm, or even no greater than about 1.4 mm. As used herein, the maximum low spot thickness is a measurement of the minimum thickness of the sapphire sheet at any point on the sapphire sheet as measured using a drop gauge. When determining the maximum low spot thickness of a sapphire sheet, a thickness map is generated as is understood by one of ordinary skill in the art and the thickness is measured every square inch. To ascertain the maximum low spot thickness, the results of the thickness maps are analyzed to determine the lowest thickness present. If a void is present, the lowest thickness present (i.e. the maximum low spot thickness) will be 0.

In certain embodiments, the sapphire sheet can have a standard deviation from planar of no greater than about 0.5 mm, no greater than about 0.3 mm, no greater than about 0.25 mm, such as no greater than about 0.2 mm, no greater than about 0.15 mm, no greater than about 0.1 mm, no greater than about 0.05 mm.

The EFG crystal growth apparatus described herein produces sapphire sheet blanks. The blanks can be cut to form a finished sapphire sheet. The blanks can be cut by, for example, a machining center or with a water jet cutter. Another particular achievement of the present disclosure is to reduce the amount of scrap material that has to be cut away from the blanks to form the finished sheets. In certain embodiments, a sapphire sheet cut from a sapphire EFG grown blank can have a surface area of the sapphire sheet of at least about 80%, at least about 85%, at least about 90%, at least about 92%, at least about 94%, at least about 95%, at least about 96%, or even at least about 98% of the surface area of the sapphire EFG grown blank.

In certain embodiments, consecutively grown sapphire sheets as described herein can have a standard deviation of the TTV value of each of the consecutively grown sapphire sheets of no greater than about 2%, no greater than about 3%, no greater than about 4%, no greater than about 5%, no greater than about 8%, or even no greater than about 10%. For example, this standard deviation of the TTV value can occur between at least 2, at least 3, at least 4, at least 5, at least 6, at least 7, at least 8, at least 9, or even at least 10 consecutively grown sapphire sheets from the same EFG growth apparatus.

Without being limited by theory, it is believed that at least the heat shield angled with respect to the side surface of the die tip can maintain a more uniform and larger thermal gradient across the thickness of the sapphire sheet during growth thereby improving dimensional stability. It has heretofore not been possible to consistently construct a sapphire sheet having features described herein, such as the maximum low spot thickness and combinations of features such as the total thickness and the maximum low spot thickness.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the items as listed below.

Item 1. An apparatus for growing a sapphire sheet via edge-defined film-fed growth (EFG) comprising a heat reflective shield angled with respect to a horizontal plane, wherein the heat reflective shield is configured to control a first thermal gradient from reflected heat in a lateral direction and a vertical direction.

Item 2. An apparatus for growing a sapphire sheet via edge-defined film-fed growth (EFG) comprising a heat reflective shield angled with respect to a horizontal plane, wherein the sapphire sheet has a length, a width, and a thickness, wherein the length≥width>thickness, and wherein the thickness is at least 0.5 mm.

Item 3. An apparatus for growing a sapphire sheet via edge-defined film-fed growth (EFG) comprising: a melt source; a die, having a die tip, adjacent the melt source; a first region adjacent an opening of the die; and a heat reflective shield adjacent the die and the first region, wherein the heat reflective shield comprises a first surface facing the die and a second surface opposite the first surface, wherein the heat reflective shield is configured to direct heat energy contacting the first surface of the heat reflective shield towards a region of lower temperature, thereby increasing the thermal gradient in a first region above the die relative to an apparatus having a heat shield parallel to the side surface of the die tip.

Item 4. A method of forming a sapphire sheet comprising: crystallizing a sapphire sheet above a die, and cooling the sapphire sheet in a first region adjacent the die, and controlling a thermal gradient across a thickness of the sapphire sheet of at least about 1.5 degrees/mm.

Item 5. A method of forming a sapphire sheet comprising: crystallizing a sapphire sheet above a die, and cooling the sapphire sheet in a first region adjacent the die, wherein cooling comprises reflecting a significant amount of radiant heat away from the first region.

Item 6. A sapphire sheet having a length, a width, and a thickness, wherein the length≥width>thickness, and wherein the sapphire sheet has at least one of the characteristics selected from the group consisting of: a Total Thickness Variation of no greater than 1.0 mm, wherein the variation in thickness is the difference between maximum and minimum thickness values along a segment spanning the length and width of the sheet; and a maximum low spot thickness of no greater than 0.75 mm.

Item 7. A sapphire sheet cut from a sapphire EFG grown blank, wherein the ratio of the surface area of the sapphire sheet is at least 90% of the surface area of the sapphire EFG grown blank.

Item 8. A batch of at least three consecutively EFG grown sapphire sheets, wherein the at least three EFG grown sapphire sheets have a standard deviation of total thickness variation of no greater than 5%.

Item 9. The apparatus, method, batch, or sapphire sheet of any one of the preceding items, wherein the sapphire sheet has a width of at least 1 inch, at least 2 inches, at least 3 inches, at least 4 inches, at least 6 inches, or even at least 8 inches.

Item 10. The apparatus, method, batch, or sapphire sheet of any one of the preceding items, wherein the sapphire sheet has a length of at least 6 inches, at least 12 inches, at least 24 inches, or even at least 30 inches.

Item 11. The apparatus, method, batch, or sapphire sheet of any one of the preceding items, wherein the sapphire sheet has a thickness of at least 0.1 mm, at least 0.2 mm, at least 0.3 mm, at least 0.4 mm, at least 0.5 mm, at least 0.6 mm, at least 0.7 mm, or even at least 0.75 mm.

Item 12. The apparatus, method, batch, or sapphire sheet of any one of the preceding items, wherein the sapphire sheet has a Total Thickness Variation of no greater than 1.0 mm.

Item 13. The apparatus, method, batch, or sapphire sheet of any one of the preceding items, wherein the sapphire sheet has a maximum low spot thickness of no greater than 0.75 mm.

Item 14. The apparatus, method, batch, or sapphire sheet of any one of the preceding items, wherein the sapphire sheet has a standard deviation from planar of no greater than 0.25 mm.

Item 15. The apparatus or method of any one of the preceding items, wherein the heat reflective shield forms an angle of no greater than about 85 degrees, no greater than about 80 degrees, no greater than about 75 degrees, or even no greater than about 70 degrees.

Item 16. The apparatus or method of any one of the preceding items, wherein the heat reflective shield forms an angle of no less than about 1 degrees, no less than about 2 degrees, no less than about 3 degrees, no less than about 4 degrees, no less than about 5 degrees, no less than about 10 degrees, no less than about 15 degrees, no less than about 20 degrees, no less than about 25 degrees, no less than about 30 degrees, no less than about 35 degrees, no less than about 40 degrees, no less than about 45 degree, no less than about 50 degrees, no less than about 55 degrees, or even no less than about 60 degrees.

Item 17. The apparatus or method of any one of the preceding items, wherein the heat reflective shield comprises a metal, in particular a refractory metal.

Item 18. The apparatus or method of any one of the preceding items, wherein the heat reflective shield has a surface angled with respect to a side surface of the die tip, and wherein a ratio of the length of the angled surface of the heat shield to the width of the sapphire sheet is less than about 2:1, less than about 1:1, less than about 1:2, less than about 1:3, or even less than about 1:4.

Item 19. The apparatus or method of any one of the preceding items, wherein the heat reflective shield is positioned such that a significant portion of heat radiating laterally from the first region is reflected toward an area of lower temperature.

Item 20. The apparatus or method of any one of the preceding items, wherein the heat reflective shield is disposed adjacent to the first region.

Item 21. The apparatus or method of any one of the preceding items, wherein the first thermal gradient is at least about 1 degrees/mm, at least about 1.3 degrees/mm, at least about 1.6 degrees/mm, at least about 2.0 degrees/mm, at least about 2.5 degrees/mm, or even at least about 3.0 degrees/mm.

Item 22. The apparatus or method of any one of the preceding items, wherein the first thermal gradient extends along the forming plane for a distance of at least about 1 cm, at least about 2 cm, at least about 3 cm, at least about 5 cm, or even at least about 10 cm.

Item 23. The apparatus or method of any one of the preceding items, further comprising a second thermal gradient adjacent to the first thermal gradient, wherein the second thermal gradient is further away from the die opening than the first thermal gradient, and wherein the second thermal gradient is less than the first thermal gradient.

Item 24. The apparatus or method of any one of the preceding items, wherein the die opening has a width of at least 1 inch, at least 2 inches, at least 3 inches, at least 4 inches, at least 6 inches, or even at least 8 inches.

Item 25. The apparatus or method of any one of the preceding items, wherein the die opening has a thickness of at least 0.1 mm, at least 0.2 mm, at least 0.3 mm, at least 0.4 mm, at least 0.5 mm, at least 0.6 mm, at least 0.7 mm, or even at least 0.75 mm.

Item 26. The apparatus or method of any one of the preceding items, wherein a ratio of the average thickness of the sapphire sheet to the thickness of the die opening is at least about 0.95:1.

Item 27. The method of any one of the preceding items, further comprising: seeding a melt fixture with a seed having a C-axis, an A-axis, an R-axis, a M-axis, a N-axis, or an S-axis orientation substantially perpendicular to a longitudinal axis of a die opening; and wherein the sapphire sheet has the same seeded orientation substantially perpendicular to the sapphire sheet's major surface.

Item 28. The method of any one of the preceding items, wherein the dwell time of a specific point on the sapphire sheet in the first region is at least 10 minutes.

Item 29. The method of any one of the preceding items, further comprising drawing the sapphire sheet at a rate of at least 2.5 cm/hr, at least 5 cm/hr, or even at least 10 cm/hr.

Item 30. The apparatus or sapphire sheet of any one of the preceding items, wherein the sapphire sheet has a C-axis, an A-axis, an R-axis, a M-axis, a N-axis, or an S-axis orientation substantially perpendicular to the sapphire sheet's major surface.

Item 31. An apparatus for growing a sapphire sheet via edge-defined film-fed growth (EFG), the apparatus comprising a heat reflective shield angled with respect to a forming plane, wherein the heat reflective shield is configured to control a first thermal gradient from reflected heat in a lateral direction and a vertical direction.

Item 32. An apparatus for growing a sapphire sheet via edge-defined film-fed growth (EFG), the apparatus comprising: a heat reflective shield adapted to be disposed adjacent a die and a first region adjacent an opening of the die, wherein the heat reflective shield comprises a first surface facing the die and a second surface opposite the first surface, wherein the heat reflective shield is configured to direct heat energy contacting the first surface of the heat reflective shield towards a region of lower temperature, thereby increasing the thermal gradient in a first region above the die relative to an apparatus having a heat shield parallel to the side surface of the die tip.

Item 33. A method of forming a sapphire sheet comprising: crystallizing a sapphire sheet above a die, and cooling the sapphire sheet in a first region adjacent the die, wherein cooling comprises reflecting a significant amount of radiant heat away from the first region.

Item 34. The method of item 33, further comprising: seeding a melt fixture with a seed having a C-axis, an A-axis, an R-axis, a M-axis, a N-axis, or an S-axis orientation substantially perpendicular to a longitudinal axis of a die opening; and wherein the sapphire sheet has the seeded orientation substantially perpendicular to the sapphire sheet's major surface.

Item 35. The method of item 33, wherein a dwell time of a specific point on the sapphire sheet in the first region is at least 10 minutes.

Item 36. The method of item 33, wherein cooling the sapphire sheet comprises providing an EFG apparatus comprising a heat reflective shield adapted to be disposed adjacent the die, and angled with respect to a forming plane.

Item 37. The apparatus or method of any one of the preceding items, wherein the heat reflective shield forms an angle with the forming plane of no greater than about 85 degrees.

Item 38. The apparatus or method of any one of the preceding items, wherein the heat reflective shield forms an angle with the forming plane of no less than about 35 degrees.

Item 39. The apparatus or method of any one of the preceding items, wherein the heat reflective shield comprises a metal.

Item 40. The apparatus or method of any one of the preceding items, wherein the heat reflective shield comprises a refractory metal.

Item 41. The apparatus or method of any one of the preceding items, wherein the heat reflective shield has a surface angled with respect to the forming plane, and wherein a ratio of the length of the angled surface of the heat shield to the width of the sapphire sheet is less than about 2:1.

Item 42. The apparatus or method of any one of the preceding items, wherein the heat reflective shield is positioned such that a significant portion of heat radiating laterally from the first region is reflected toward an area of lower temperature.

Item 43. The apparatus or method of any one of the preceding items, wherein the heat reflective shield is disposed adjacent to the first region.

Item 44. The apparatus or method of any one of the preceding items, wherein the first thermal gradient is at least about 1 degrees/mm.

Item 45. The apparatus or method of any one of the preceding items, wherein the first thermal gradient extends along the forming plane for a distance of at least about 3 cm.

Item 46. The apparatus or method of any one of the preceding items, further comprising a second thermal gradient adjacent to the first thermal gradient, wherein the second thermal gradient is further away from the die opening than the first thermal gradient, and wherein the second thermal gradient is less than the first thermal gradient.

Item 47. The apparatus or method of any one of the preceding items, wherein the apparatus is further adapted to support a die having an opening having a width of at least 1 inch.

Item 48. The apparatus or method of any one of the preceding items, wherein the apparatus is further adapted to support a die having an opening having a thickness of at least 0.1 mm.

Item 49. The apparatus or method of any one of the preceding items, wherein the apparatus is adapted to grow a sapphire sheet having a ratio of an average thickness of the sapphire sheet to the thickness of the die opening of at least about 0.95:1 across the entire width and over a length of at least 10 cm.

Item 50. The apparatus or method of any one of the preceding items, wherein the apparatus is adapted to grow a sapphire sheet having an A-axis orientation substantially perpendicular to the sapphire sheet's major surface.

EXAMPLES

The concepts described herein will be further described in the Examples, which do not limit the scope of the invention described in the claims. The Examples demonstrate performance of scintillation crystals of different compositions. Numerical values as disclosed in this Examples section may be averaged from a plurality of readings, approximated, or rounded off for convenience.

Example 1

Six ribbons of A-plane sapphire blanks were grown in a 14.0 system EFG growth machine available from Saint-Gobain. Three runs were produced with a vertically oriented shield, and three runs were produced using a shield having an angle of 83° with respect to the horizontal plane. The maximum low spot thickness was then identified and measured using a drop gauge. The results are provided below in Table 1.

TABLE 1

| Example # | Configuration of Heat Shield | Maximum Low Spot Thickness (mm) | Visual Inspection |
| --- | --- | --- | --- |
| C1 | Vertical | 0.060 | Good growth with some low areas at end of crystal |
| C2 | Vertical | 0.090 | Good growth with some low areas at end of crystal |
| 3 | Angled | 0.000 | Good Growth with very good dimensional control |
| 4 | Angled | 0.050 | Good Growth with very good dimensional control |
| 5 | Angled | 0.050 | Good Growth with very good dimensional control |
| C6 | Vertical | 0.100 | Heavy "Cat Scratch" low areas throughout run |

As illustrated in Table 1, from visual inspection examples 3, 4, and 5 exhibited improved dimensional stability. The improved dimensional stability was further quantified with by measuring the maximum low spot thickness. As illustrated, examples 3, 4, and 5 exhibited an improved maximum low spot thickness over examples C1, C2, and C6.

Figure 3:
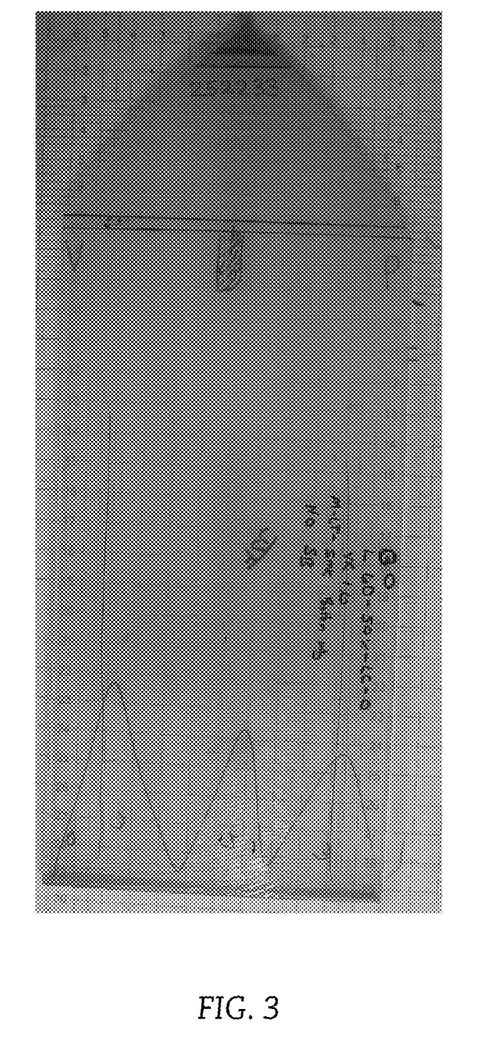
FIG. 3 illustrates a sapphire sheet blank grown according to example C1.

FIG. 3 illustrates a photograph of the A-plane sapphire blank grown in example C1 overlaid on a piece of graph paper to see the length of the sheet. As can be seen, the sapphire blank has low areas at the end of the sapphire sheet.

Figure 4:
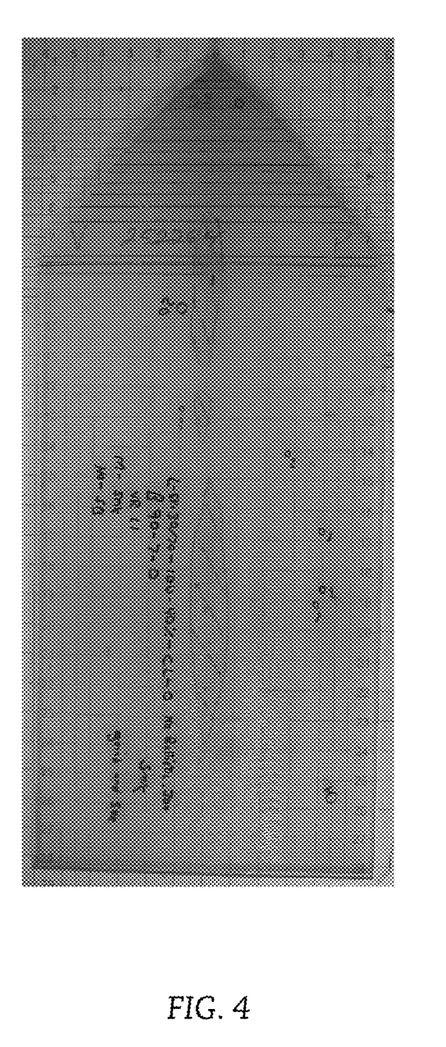
FIG. 4 illustrates a sapphire sheet blank grown according to example C2.

FIG. 4 illustrates a photograph of the A-plane sapphire blank grown in example C2 overlaid on a piece of graph paper to see the length of the sheet. As can be seen, the sapphire blank has low areas at the end of the sapphire sheet.

Figure 5:
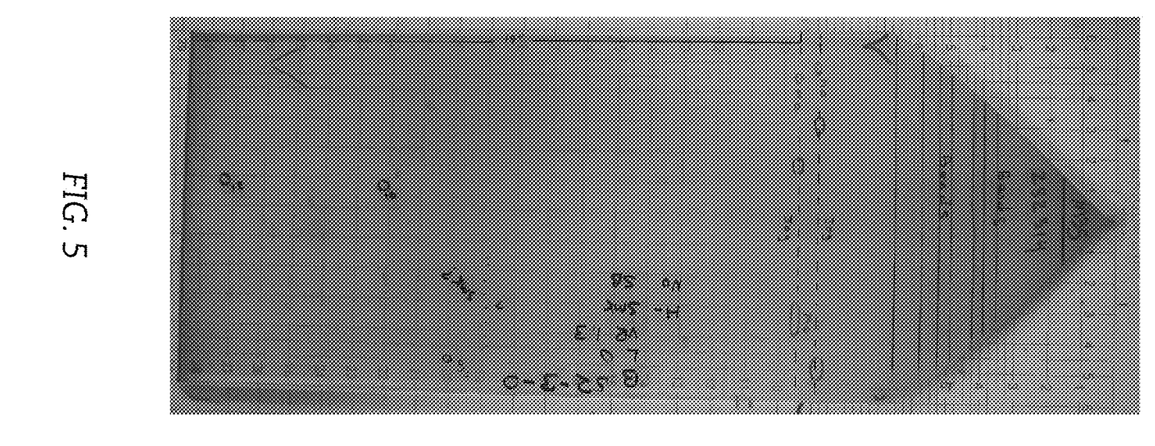
FIG. 5 illustrates a sapphire sheet blank grown according to example 3.

FIG. 5 illustrates a photograph of the A-plane sapphire blank grown in example 3 overlaid on a piece of graph paper to see the length of the sheet. As can be seen, the sapphire blank has very good dimensional control with little to no low spots.

Figure 6:
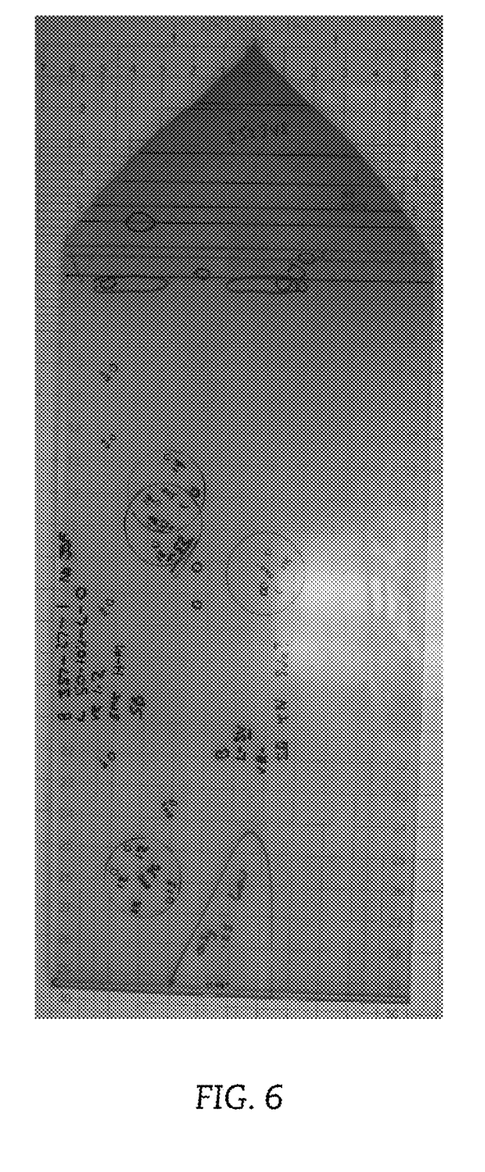
FIG. 6 illustrates a sapphire sheet blank grown according to example 4.

FIG. 6 illustrates a photograph of the A-plane sapphire blank grown in example 4 overlaid on a piece of graph paper to see the length of the sheet. As can be seen, the sapphire blank has very good dimensional control with little to no low spots.

Figure 7:
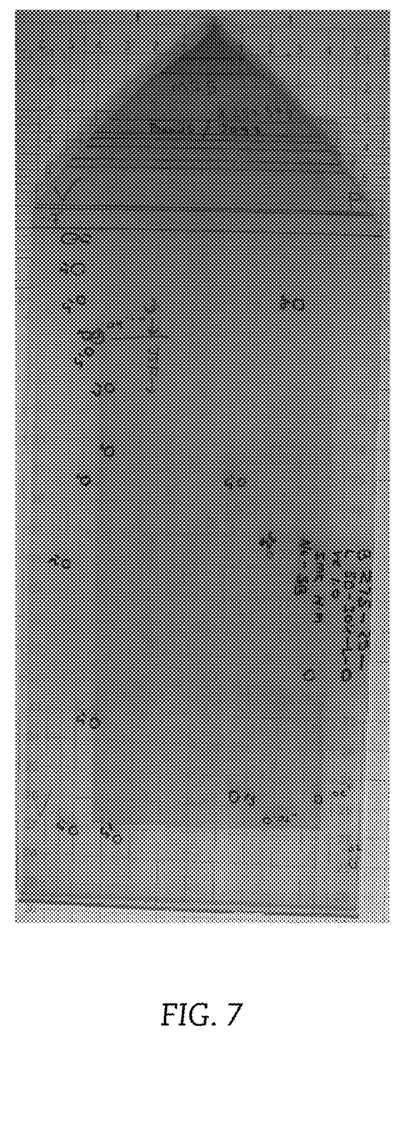
FIG. 7 illustrates a sapphire sheet blank grown according to example 5.

FIG. 7 illustrates a photograph of the A-plane sapphire blank grown in example 5 overlaid on a piece of graph paper to see the length of the sheet. As can be seen, the sapphire blank has very good dimensional control with little to no low spots.

Figure 8:
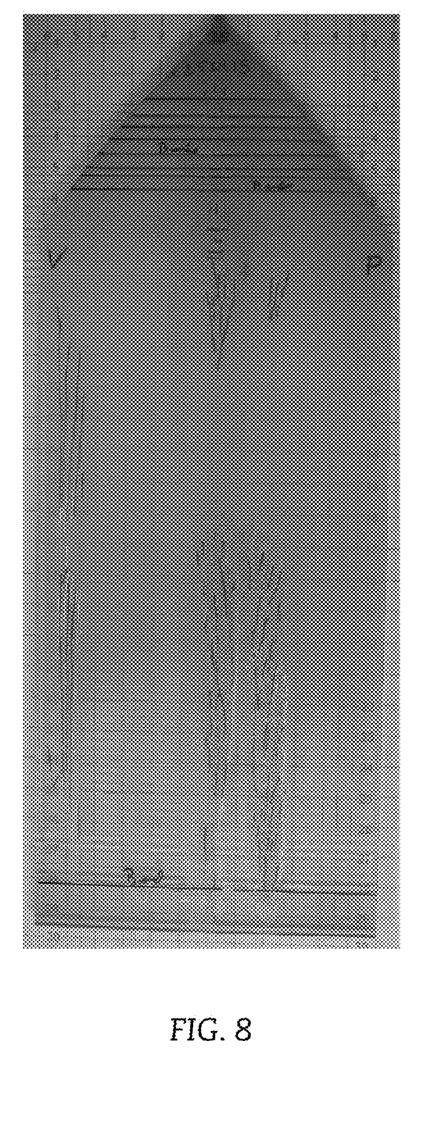
FIG. 8 illustrates a sapphire sheet blank grown according to example C6.

FIG. 8 illustrates a photograph of the A-plane sapphire blank grown in example C6 overlaid on a piece of graph paper to see the length of the sheet. As can be seen, the sapphire blank has heavy "cat scratch" low areas throughout the blank.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An apparatus for growing a sapphire sheet via edge-defined film-fed growth (EFG), the apparatus comprising:
   a die; and
   a heat reflective shield including:
     a first face positioned to form a first angle with respect to a horizontal plane; and
     a second face positioned to form a second angle with respect to the horizontal plane,
   wherein:
     the first and second faces are not on a same plane; and
     the first and second faces of the heat reflective shield are positioned to control a first thermal gradient from reflected heat in a lateral direction and a vertical direction.

2. An apparatus for growing a sapphire sheet via edge-defined film-fed growth (EFG), the apparatus comprising:
a die having a die tip;
a heat reflective shield adapted to be disposed adjacent the die;
a first region adjacent an opening of the die; and
a second region above the first region and having a lower temperature than the first region,
wherein the heat reflective shield comprises a first surface facing the die and a second surface opposite the first surface; and
wherein the heat reflective shield is positioned to direct heat energy contacting the first surface of the heat reflective shield towards the second region, thereby increasing a first thermal gradient in the first region above the die relative to an apparatus having a heat shield parallel to the side surface of the die tip.

3. The apparatus of claim 1, wherein the first angle, the second angle, or both are no greater than about 85 degrees.

4. The apparatus of claim 1, wherein the first angle, the second angle, or both are no less than about 35 degrees.

5. The apparatus of claim 1, wherein the heat reflective shield comprises a metal.

6. The apparatus of claim 1, wherein the heat reflective shield comprises a refractory metal.

7. The apparatus of claim 1, wherein the heat reflective shield has a surface angled with respect to the horizontal plane, and wherein a ratio of the length of the angled surface of the heat shield to the width of the sapphire sheet is less than about 2:1.

8. The apparatus of claim 1, wherein the heat reflective shield is positioned such that a significant portion of heat radiating laterally from a first region is reflected toward an area having a lower temperature and above the first region.

9. The apparatus of claim 1, wherein the heat reflective shield is disposed adjacent to the die.

10. The apparatus of claim 1, wherein the first thermal gradient is at least about 1 degrees/mm.

11. The apparatus of claim 1, wherein the first thermal gradient extends along the forming plane for a distance of at least about 3 cm.

12. The apparatus of claim 1, further comprising a second thermal gradient adjacent to the first thermal gradient, wherein the second thermal gradient is further away from the die than the first thermal gradient, and wherein the second thermal gradient is less than the first thermal gradient.

13. The apparatus of claim 1, wherein the die has an opening having a width of at least 1 inch.

14. The apparatus of claim 1, wherein the die has an opening having a thickness of at least 0.1 mm.

15. The apparatus of claim 1, wherein the apparatus is adapted to grow a sapphire sheet having a ratio of an average thickness of the sapphire sheet to a thickness of a die opening of at least about 0.95:1 across an entire width and over a length of at least 10 cm of the sapphire sheet.

16. The apparatus of claim 2, wherein the heat reflective shield comprises:
a first face comprising the first surface facing the die and the second surface opposite the first surface, and
a second face comprising a third surface facing the die and a fourth surface opposite the third surface,
wherein the heat reflective shield is positioned such that heat energy contacting the third surface of the second face is directed towards the second region.

* * * * *